United States Patent [19]

Kawasaki et al.

[11] 4,341,994
[45] Jul. 27, 1982

[54] POWER LEVEL MEASUREMENT SYSTEM

[75] Inventors: Tetsuro Kawasaki; Hiromichi Toda, both of Tokyo, Japan

[73] Assignee: Anritsu Electric Company Limited, Tokyo, Japan

[21] Appl. No.: 135,904

[22] Filed: Mar. 31, 1980

[30] Foreign Application Priority Data

Mar. 31, 1979 [JP] Japan .................................. 54-37741

[51] Int. Cl.³ ...................... G01R 15/10; G01R 21/04
[52] U.S. Cl. ...................................... 324/132; 324/95; 324/115; 324/118
[58] Field of Search ................. 324/132, 115, 118, 95, 324/119; 364/573; 328/142, 143

[56] References Cited

U.S. PATENT DOCUMENTS 3,156,859  11/1964  Cox ...................................... 324/118
3,611,131  10/1971  Burkhart et al. ...................... 324/132
4,255,706   3/1981  Soojian ................................ 324/132

Primary Examiner—Ernest F. Karlsen
Attorney, Agent, or Firm—Holman & Stern

[57] ABSTRACT

A power level measurement system includes a power level sensor having a linear response to power level variations for power levels below a predetermined level and a non-linear response above the predetermined level, a DC amplifier and linearity compensator for measuring power and amplitude levels above the predetermined power level, a switched amplifier circuit containing a DC to AC converter circuit, an AC amplifier and a detector for measuring power levels below the predetermined level, means for determining whether the power level of the high frequency signal is above or below the predetermined power level and for accordingly selecting either the DC amplifier or the switched amplifier system in accordance with this power level, and display means for displaying the output from the selected amplifier system.

5 Claims, 3 Drawing Figures

Fig. I
PRIOR ART

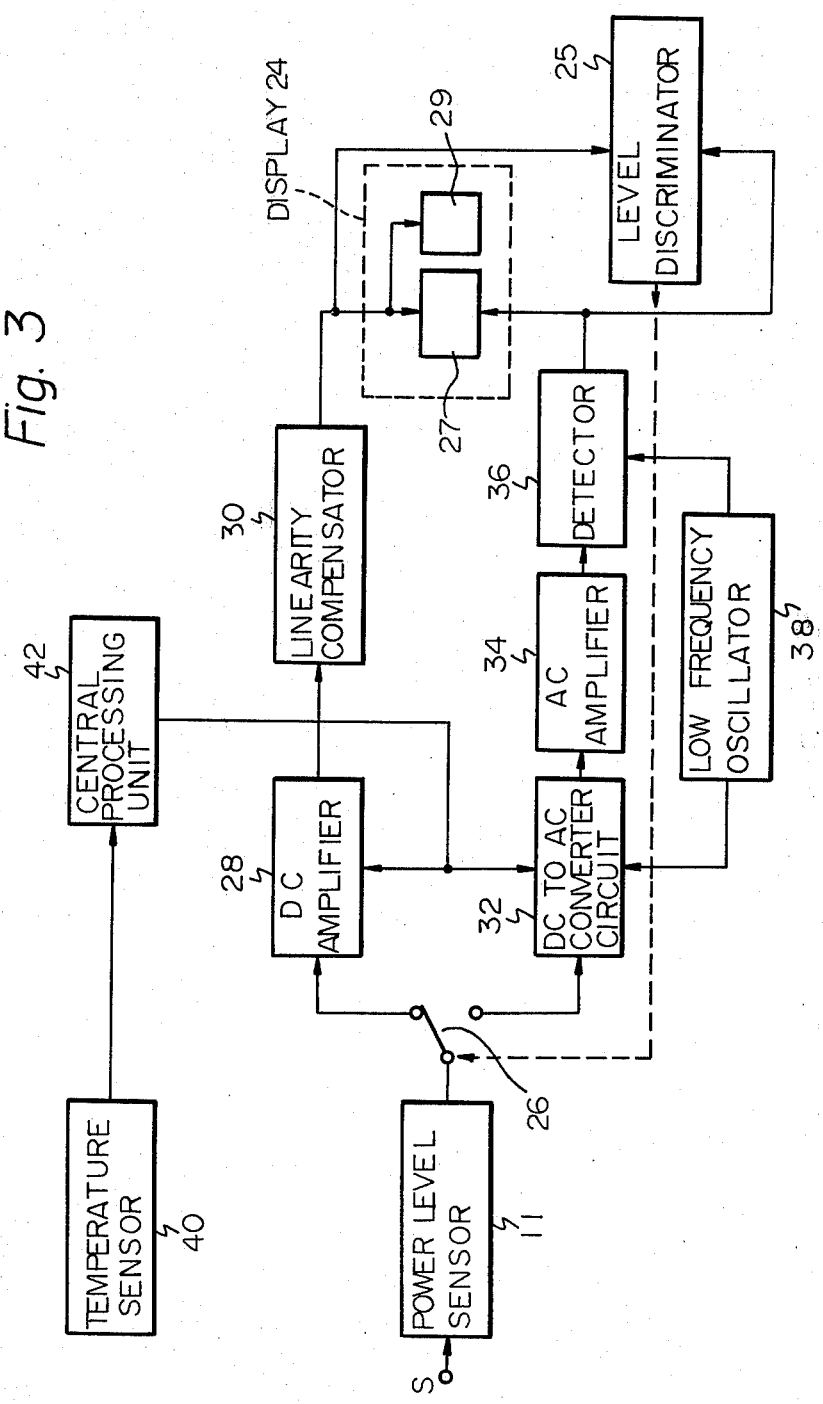

POWER LEVEL MEASUREMENT SYSTEM

BACKGROUND OF THE DISCLOSURE

A commonly used method of measuring the power level of a high frequency signal, or of measuring the amplitude response characteristics of a circuit by applying a sweep frequency signal thereto and measuring the amplitude variations of the resultant output signal, involves the use of a device such as a barretter as a sensor for the high frequency signal being measured. Such a device displays a change in resistance which is proportional to the amplitude of a high frequency signal which is applied to it, and thus can be used for example in a bridge circuit in conjunction with capacitors and resistors to produce an output signal which indicates the amplitude or power level of a high frequency signal coupled to the sensor. Use of a device such as a barretter for this purpose brings a number of disadvantages. First, since it is normally necessary to measure power or amplitude levels down to very low levels, it is usual to utilize an amplifier circuit which is of the chopper type, incorporating a DC to AC converter circuit. This DC to AC conversion is normally performed at a fixed frequency, and produces noise spikes in the resultant output signal. When the amplitude of the signal to be measured is very low, this spike noise makes it difficult to observe the amplified signal being measures, when this is for example being displayed on a cathode ray tube display. If it is attempted to remove this spike noise by increasing the frequency of the DC to AC conversion process and by filtering out this noise, the result is to introduce an effective drift voltage into the measured signal, leading to reduced accuracy of measurement. Another disadvantage of such a conventional system is that, due to the low response speed of a sensor such as a barretter, it is difficult or impossible to utilize the output signal to observe an amplitude response characteristic on a cathode ray tube display.

It is also possible to measure the power or amplitude level of a high frequency signal using a device such as a diode as a sensor. Such a sensor has a very high speed of response, and has a linear response to changes in input signal power level at low signal levels, but displays increasing non-linearity as the amplitude of the input signal is increased above a certain level.

With the present invention, the disadvantages of such a diode type of power level sensor are eliminated, by applying linearity compensation to the output signal from the power level sensor when the input signal level exceeds a predetermined reference level.

SUMMARY OF THE INVENTION

The present invention relates to a power level measuring system for measuring the power level and amplitude response of a relatively high frequency signal, which utilizes a power level sensor having a linear response to variations in the power level of an applied high frequency signal below a predetermined power level, and a non-linear response above that predetermined power level. Such a power level sensor typically comprises a diode power level sensor. A power level measurement system according to the present invention comprises a DC amplifier, a switched amplifier system comprising a DC to AC converter circuit, an AC amplifier and a detector, some means for discriminating whether the power level of the applied signal is above or below a predetermined reference level, and means which is responsive to the power level discrimination means for amplifying the input signal either by the switched amplifier system, when the input signal power level is below the predetermined reference level, or by the DC amplifier, when the input signal power level is above the predetermined reference level. In the latter case, a linearity compensator connected to the output of the DC amplifier compensates for non-linearity of the power level sensor characteristics. A display device displays the output from the selected amplifier, to indicate the measured power level and amplitude.

A power level measurement system according to the present invention therefore provides the advantage of high speed of response given by a diode type of sensor. In addition, when the signal to be measured is above a predetermined level, it is measured by amplification in a DC amplifier which does not involve DC to AC conversion. The output from this amplifier can therefore be conveniently observed on a cathode ray tube, for example to determine an amplitude response characteristic, without the display being disturbed by the presence of noise spikes.

BRIEF DESCRIPTION OF THE DRAWINGS

In the attached drawings:

FIG. 3 is a simplified block diagram illustrating a second embodiment of the present invention.

DESCRIPTION OF THE PREFERRED EMBODIMENTS

Figure 1:
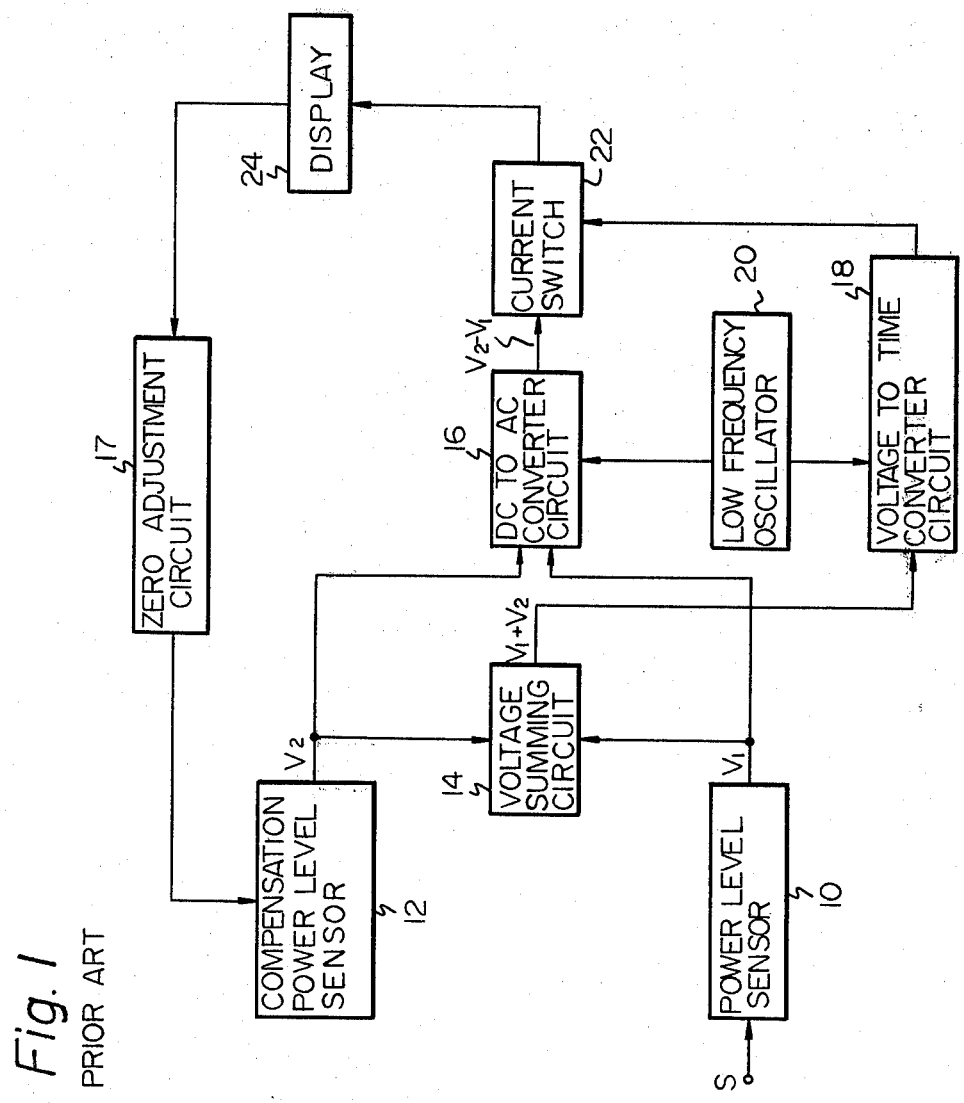
FIG. 1 is a simplified block diagram illustrating a power level measurement system of conventional type, in which a power level sensor having a high sensitivity to changes in ambient operating temperature is used.

Before describing embodiments of the present invention, a typical prior art system for measuring the power level (or amplitude) or a high frequency signal will be discussed, with reference to FIG. 1. This system includes a power level sensor, denoted by numeral 10. This power level sensor typically comprises a barretter, which may be capacitatively coupled to receive the high frequency signal being measured, and a bridge circuit containing the barretter, for measuring changes in resistance of the barretter with the power level of the applied signal. Such changes are due to temperature changes in the barretter, and thus the output voltage from the power level sensor 10 (designated as $V_1$) will vary in accordance with variations in ambient operating temperature, unless means are provided for compensating for such changes. Such means are provided by a compensation power level sensor 12, which is constructed to be identical to power level sensor 10. The output signals $V_1$ from power level sensor 10 and $V_2$ from compensation power level sensor 12, are input to a voltage summing circuit 14, which produces an output signal $(V_1 + V_2)$, i.e. equal to the sum of the power level sensor input signals. Output signals $V_1$ and $V_2$ from sensors 10 and 12 are also input to a DC to AC converter circuit 16, which may consist of an FET chopper circuit. This converts a DC signal whose value is the difference between the output signals from power level sensors 10 and 12, i.e. $(V_2 - V_1)$, into an AC signal. The output signal from voltage summing circuit 14 is input to a voltage to time converter circuit 18, which transforms this signal into a pulse train in which the pulse duration is proportional to the level of the input signal, i.e. to ($V_1+V_2$). A low frequency oscillator 20 is connected to provide a low frequency drive signal to voltage to time converter circuit 18 and DC to AC converter circuit 16, this drive signal having a frequency typically of the order of 20 kHz.

The output signals from DC to AC converter 16 and from voltage to time converter circuit 18 are applied to a current switch 22. Current switch 22 produce an output signal comprising a train of pulses in which the pulse amplitude is proportional to the difference between the output voltage $V_1$ of power level sensor 10 and output voltage $V_2$ of compensating power level sensor 12, and whose pulse duration is proportional to the sum of voltages $V_1$ and $V_2$, while the repetition frequency of the pulse train is that of the output signal from low frequency oscillator 20. Numeral 24 denotes a display, such as a current meter, which receives the pulses produced by current switch 22, and indicates a value of current in accordance with these pulses. The output signal from current switch 22 can be expressed as:

$$(V_1+V_2)\cdot(V_2-V_1)=V_2^2-V_1^2$$

For a zero level signal input to power level sensor 10, the display 24 should read a value of zero, and this is achieved by feeding back the output signal from current switch 22 through a zero adjustment circuit 17. When such a zero adjustment has been performed, then thereafter the current which is read by display 24 will be proportional to the square of $V_1$, i.e. to the power of the input signal applied to power level sensor 10. Such a system can also be used to measure the amplitude of the input signal applied to power level sensor 10, if required, by utilizing the output signal from DC to AC converter circuit 16 directly.

Such a system has various disadvantages. The speed of response of the power level sensor 10 is very low. Thus, although the system apparently offers the capability for simultaneously measuring the power level and the amplitude of an input signal, in fact if the amplitude of the input signal is varying at even a relatively low frequency, e.g. of the order of the 50 or 60 Hz of a commercial power supply, the system cannot respond to the amplitude variations, so that measurement of the signal amplitude is not actually possible in many cases. Another disadvantage is that a relatively high level of noise, in the form of noise spikes, is produced by the DC to AC converter 16. This noise makes it difficult to observe the output signal from DC to AC converter 16, if this signal is displayed on means such as a cathode ray tube, to examine the amplitude variations of the input signal.

Figure 2:
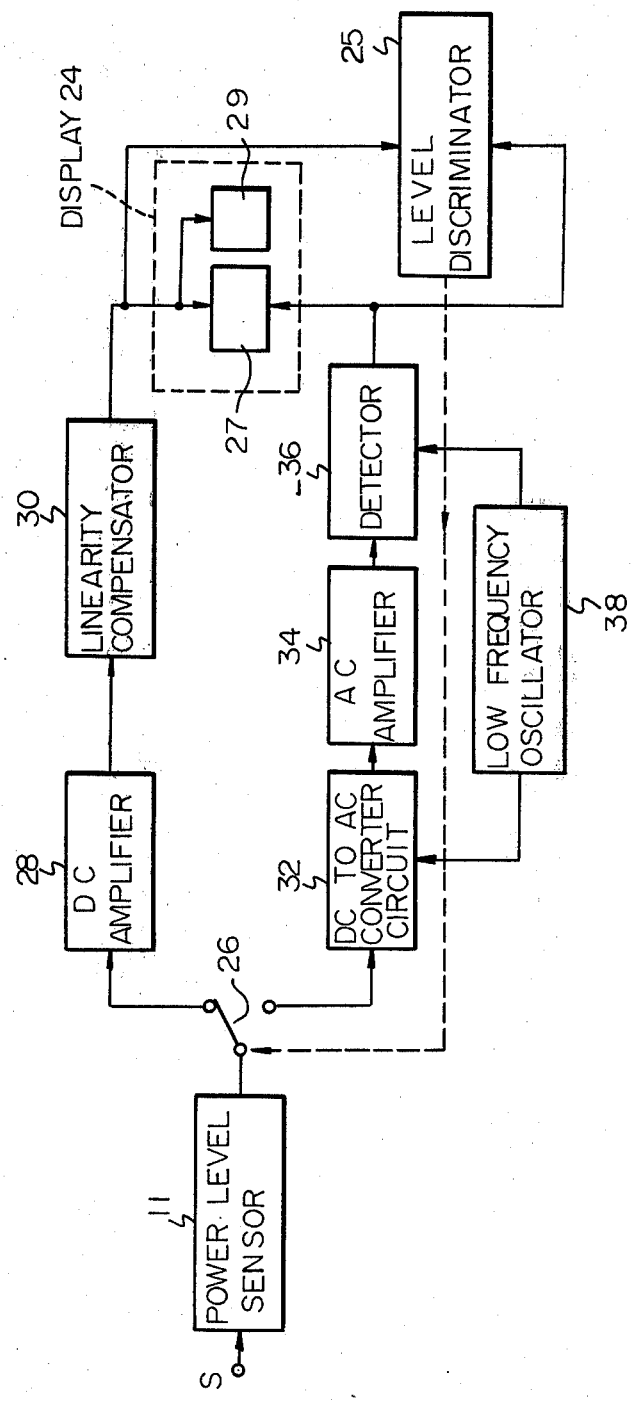
FIG. 2 is a simplified block diagram illustrating a first preferred embodiment of the present invention.

Referring now to FIG. 2, a first embodiment of a power level measurement system according to the present invention will be described. Here, numeral 11 denotes a power level sensor, basically comprising a device such as a diode detector having a high response speed. A diode displays a square law response to an applied voltage up to a certain level of applied voltage, and hence can be utilized to generate a signal which is proportional to the power level of an input signal. However, such a power level sensor displays a non-linear relationship between the applied signal power level and the output signal produced, for input signal power levels above a certain level. With the present invention this problem is overcome by utilizing the output from the power level sensor directly to measure the power level, when the applied signal power level is within the range of linear response of the power level sensor, and by applying linearity compensation to the output signal from the power level sensor when the applied signal power level is above the range of linear response of the power level sensor. This is achieved by means of a switch 26, whose operation is controlled in accordance with the input signal power level, as will be described hereinafter.

When the applied signal power level is within the range of linear response of power level sensor 11, then the output signal from power level sensor 11 is applied by switch 26 to the input of a switched amplifier system comprising a DC to AC converter 32, an AC amplifier 34, a synchronous detector 36 and a low frequency oscillator 38, which produces a low frequency signal to actuate DC to AC converter 32 and synchronous detector 36. This system provides an amplified DC output signal which is relatively free from the effects of drift and noise, and so is advantageous when the level of output signal from power level sensor 11 is relatively small, i.e. when the input signal to power level sensor 11 is below the reference level determining the upper limit of the range of input power levels for which power level sensor 11 displays a linear response. When the input signal applied to power level sensor 11 is above the reference level referred to above, then switch 26 applies the output signal from power level sensor 11 to the input of a DC amplifier 28. In this case, since the signal level is relatively high, there is no necessity for using a switched amplitude system. The output signal from DC amplifier 28 is applied to a linearity compensator 30, which processes the signal input thereto in such a way as to compensate for the non-linearity of response of the power level sensor 11. The output signal from linearity compensator 30 and from synchronous detector 36 are applied to a display 24. This may comprise a meter, a digital display unit, or a cathode ray tube display.

When amplifying a low-level signal through the amplifier circuit consisting of DC to AC converter 32, AC amplifier 34 and detector 36, some switching noise spikes will be present in the output signal from synchronous detector 36. This will introduce an error in the value of power level indicated by display 24, when the signal level being amplified is very low. To reduce the amount of this error, the frequency of performing DC to AC conversion can be lowered by lowering the operating frequency of low frequency oscillator 38, which can be freely adjusted to a suitable value.

The output signals from linearity compensator 30 and from synchronous detector 36 are also applied to a level discriminator circuit 25. Level discriminator circuit 25 determines whether the level of the signal input to power level sensor 11 is above or below a predetermined threshold level. This threshold level is equal to or less than the input signal power level above which the operation of power level sensor 11 becomes non-linear. As indicated by the dotted line in FIG. 2, an output signal from level discriminator 25 controls the operation of switch 26. For example, if the output signal level from synchronous detector should exceed a level corresponding to the input signal threshold level referred to above, when switch 26 is coupling the output signal from power level sensor 11 to the input of DC to AC converter circuit 32, then this will be detected by level discriminator 25. As a result, level discriminator 25 will cause switch 26 to connect the output from power level sensor 11 to the input of DC amplifier 28, so that linearity compensation will be applied by means of linearity compensator 30. Similarly, if the output signal level from linearity compensator 30 should fall below a level corresponding to the input signal threshold level referred to above, then this will be detected by level discriminator circuit 25, which will thereby cause switch 26 to couple the output from power level sensor 11 to the input of DC to AC converter 32.

Thus, the output signal from power level sensor 11 is amplified either directly, by means of the switched amplifier circuit of DC to AC converter 32, AC amplifier 34 and synchronous detector 36, or is amplified with linearity compensation applied by means of linearity compensator 30, depending upon whether the input signal power level applied to power level sensor 11 is above or below a predetermined threshold level. In this way a linear relationship is maintained between the input signal power level and the amplified DC signal which is applied to display 24, irrespective of the input signal power level.

The amplification path consisting of DC amplifier 28 and linearity compensator 30 is used to measure both power level and amplitude response. The amplification path consisting of DC to AC converter 32, AC amplifier 34 and detector 36 is used to measure only power levels. The outputs from linearity compensator 30 and from detector 36 may therefore both be coupled to a power indicating device, as denoted by numeral 27 in display 24. Amplitude response may be measured by coupling the output from linearity compensator 30 to an indicating device such as a cathode ray tube display, as indicated by numeral 29 in display 24. In this case, since DC amplifier 28 does not use a DC to AC conversion process, no noise spikes caused by switching will appear on the displayed amplitude response.

A second embodiment of the present invention is shown in FIG. 3. The operation of this embodiment is essentially the same as that of the first embodiment, and circuit blocks having the same function as in the embodiment of FIG. 2 are provided with identical reference numerals. However, the embodiment of FIG. 3 is provided with temperature compensation means, to compensate for drifts in the output signal level from power level sensor 11 with changes in ambient operating temperature. The temperature compensation means comprise a temperature sensor 40, consisting of a device, such as a diode, which displays an identical relationship between ambient operating temperature and an output signal voltage produced therefrom to that displayed power level sensor 11. The output signal voltage from temperature sensor 40 is processed by digital signal processing means 42 which is referred to herein for brevity of description as a central processing unit, or CPU. The CPU 42 produces output signals which are applied to DC amplifier 28 and to DC to AC converter 32, and which serve to perform zero-adjustment of the operation thereof such as to compensate for the effects of variations in ambient operating temperature upon power level sensor 11. In other words, the temperature compensation signals applied to DC amplifier 28 and DC to AC converter circuit 32 effectively causes each of these circuits to operate such as to provide an output signal level of zero when the input signal level applied to power level sensor 11 is zero, regardless of the effects of temperature drift upon the operation of power level sensor 11.

It should be noted that the position at which switch 26 is connected in the embodiments of FIG. 2 and FIG. 3 may be altered from that shown therein. For example, the output signal from power level sensor 11 may be permanently connected to the inputs of DC amplifier 28 and DC to AC converter 32, and switch 26 connected such as to couple either the output signal from linearity compensator 30 or that from synchronous detector 36 to the display 24.

It should further be noted that it is possible to utilize a DC amplifier circuit other than the switched amplifier circuit comprising DC to AC converter 32, AC amplifier 34, synchronous detector 36 and low frequency oscillator 38, shown in the embodiments of FIG. 2 and FIG. 3. The essential features of the present invention reside in the fact that an output signal from a power level sensor whose operation is linear over a certain range of input signal levels and is non-linear outside that range of signal levels is amplified either directly or with linearity compensation applied, before being displayed, and that selection of the mode of amplification is performed in accordance with the level of that input signal.

Although the present invention has been shown and described with reference to specific embodiments, various changes and modifications of these embodiments are possible, which fall within the scope claimed for the present invention. The above description of the preferred embodiments should therefore be interpreted in an illustrative, and not in a limiting sense.

What is claimed is:

1. A power level measuring system for measuring the power level and amplitude of an input signal, comprising:

a power level sensor comprising a diode, coupled to receive said input signal and responsive thereto for producing an output signal indicative of the power level of said input signal, said output signal varying in amplitude in a linear manner with respect to variations in the power level of said input signal for values of said input signal power level which are below a predetermined threshold value of said diode;

first amplifier means for amplifying said output signal from said power level sensor;

second amplifier means for amplifying said output signal from said power level sensor and further for compensating for a non-linear relationship between said input signal applied to said power level sensor and said output signal from said power level sensor when said input signal is above a predetermined level, said second amplifier means comprising a DC amplifier coupled to receive said power level sensor output signal and a linearity compensation circuit coupled to receive an output signal from said DC amplifier for compensating said power level of said output signal from said DC amplifier when said input signal is above said predetermined threshold value of said diode;

display means for displaying the power level and ampliftude of said input signal applied to said power level sensor, said display means comprising a display device coupled to receive output signals from said first and second amplifier means for thereby displaying a power level of said input signal, and a cathode ray tube display device coupled to receive an output signal from said second amplifier means for thereby displaying an amplitude of said input signal;

level discriminator means coupled to receive output signals from said first and second amplifier means, for selectively producing control signals in accordance with whether either one of an output signal from said first amplification means and an output signal from said second amplifier means is above a value corresponding to said predetermined level of said input signal; and switching means responsive to said control signals from said level discriminator means for selectively applying said output signal from said first amplifier means and said output signal from said second amplifier means to said display means.

2. A power level measuring system according to claim 1, in which said first amplifier means comprises a switched amplifier system, comprising a DC to AC converter coupled to receive said output signal from said power level sensor, an AC amplifier circuit coupled to receive an output signal from said DC to AC converter, a synchronous detector circuit coupled to receive an output signal from said AC amplifier circuit, and a low frequency oscillator circuit for producing a low frequency signal to control the operation of said DC to AC converter circuit and said synchronous detector circuit.

3. A power level measuring system according to claim 1, and further comprising temperature compensation means for compensating for variations in said output signal from said power level sensor due to changes in ambient operating temperature.

4. A power level measuring system according to claim 3, in which said temperature compensation means comprises a temperature sensor for producing an output signal having a similar variation with respect to changes in ambient operating temperature to said output signal from said power level sensor, and digital signal processing means coupled to receive said output signal from said temperature sensor and responsive thereto for producing temperature compensation signals, said temperature compensation signals being applied to said first and second amplifier means, whereby the levels of output signals produced by said first and second amplifier means are modified to compensate for variations in said output signal level from said power level sensor caused by changes in ambient operating temperature.

5. A power level measuring system for measuring the power level and amplitude of an input signal, comprising:

a power level sensor comprising a diode for producing an output signal indicative of a power level of an input signal applied thereto, said output signal varying in amplitude in a linear manner with respect to variations in the power level of said input signal for values of said input signal power level which are below a predetermined threshold value of said diode;

a switch coupled to selectively apply said output signal from said power level sensor to a first and second terminal thereof;

a DC amplifier coupled to receive said output signal from said power level sensor from said first terminal of said switch;

a linearity compensation circuit coupled to receive an output signal from said DC amplifier, for thereby producing an output signal having compensation applied thereto for a non-linear relationship between said input signal applied to said power level sensor and said output signal from said power level sensor when said input signal is above a predetermined value;

a DC to AC converter circuit coupled to receive said output signal from said power sensor from said second terminal of said switch;

an AC amplifier circuit coupled to receive an output signal produced by said DC to AC converter circuit;

a synchronous detector circuit coupled to receive an output signal from said AC amplifier circuit;

a low frequency oscillator circuit for producing a low frequency signal, said low frequency signal being applied to said DC to AC converter circuit and said synchronous detector circuit for controlling the operation thereof;

display means including a display device coupled to receive output signals from said linearity compensation circuit and from said synchronous detector circuit for displaying a power level of said input signal applied to said power level sensor and a cathod ray tube display device coupled to receive an output signal from said DC amplifier for displaying an ampliftude of said input signal;

level discriminator circuit means coupled to receive said output signals from said linearity compensation circuit and from said synchronous detector circuit, for producing control signals in accordance with a level of said output signals; and said control signals being applied to control said switch such that said output signal from said power level sensor is coupled to said first terminal of said switch when a level of one of said output signals applied to said level discriminator circuit means is above a value corresponding to said predetermined level of said input signal applied to said power level sensor, and such that said output signal from said power level sensor is coupled to said second terminal of said switch when said output signals applied to said level discriminator circuit means has a value below said predetermined level.

* * * * *